(12) United States Patent
Li et al.

(10) Patent No.: US 10,636,381 B2
(45) Date of Patent: Apr. 28, 2020

(54) DISPLAY DEVICE

(71) Applicant: PLAYNITRIDE INC., Tainan (TW)

(72) Inventors: Yun-Li Li, Tainan (TW); Tzu-Yang Lin, Tainan (TW)

(73) Assignee: PLAYNITRIDE INC., Tainan (TW)

( * ) Notice: Subject to any disclaimer, the term of this patent is extended or adjusted under 35 U.S.C. 154(b) by 27 days.

(21) Appl. No.: 16/112,667

(22) Filed: Aug. 25, 2018

(65) Prior Publication Data
US 2019/0080664 A1 Mar. 14, 2019

(30) Foreign Application Priority Data
Sep. 13, 2017 (TW) .............................. 106131482 A

(51) Int. Cl.
| | | |
|---|---|---|
| G09G 3/38 | (2006.01) | |
| G09G 3/34 | (2006.01) | |
| H01L 31/167 | (2006.01) | |
| H01L 33/58 | (2010.01) | |
| H01L 25/075 | (2006.01) | |
| H01L 25/16 | (2006.01) | |

(52) U.S. Cl.
CPC ............ *G09G 3/38* (2013.01); *G09G 3/3406* (2013.01); *G09G 3/3433* (2013.01); *H01L 31/167* (2013.01); *H01L 33/58* (2013.01); G09G 2320/0626 (2013.01); G09G 2360/144 (2013.01); H01L 25/0753 (2013.01); H01L 25/167 (2013.01)

(58) Field of Classification Search
CPC .................................................. G09G 2360/14
See application file for complete search history.

(56) References Cited

U.S. PATENT DOCUMENTS

| | | | | |
|---|---|---|---|---|
| 2012/0113164 | A1* | 5/2012 | Furukawa | G09G 3/3426 345/690 |
| 2012/0182332 | A1* | 7/2012 | Liu | G09G 3/2007 345/691 |
| 2014/0160099 | A1* | 6/2014 | Li | G09G 3/36 345/207 |
| 2014/0160175 | A1* | 6/2014 | Uemura | G09G 3/20 345/690 |
| 2014/0184577 | A1* | 7/2014 | Kim | G09G 5/10 345/207 |
| 2015/0187283 | A1* | 7/2015 | Jiang | G09G 3/342 345/690 |
| 2016/0104411 | A1* | 4/2016 | Nathan | G09G 3/2007 345/690 |
| 2016/0225301 | A1* | 8/2016 | Scepanovic | G09G 3/36 |
| 2017/0018214 | A1* | 1/2017 | Black | G02F 1/292 |

\* cited by examiner

*Primary Examiner* — Sepehr Azari
(74) *Attorney, Agent, or Firm* — Maschoff Brennan

(57) ABSTRACT

A display device includes a display panel and at least one light modulation panel. The display panel includes a substrate and a plurality of micro light emitting semiconductors disposed on the substrate. The light modulation panel is disposed on a light emitting surface of the display panel and includes a light modulation unit. The light modulation panel is configured to change a transmittance of the light modulation unit according to a light modulation control signal.

6 Claims, 3 Drawing Sheets

DISPLAY DEVICE

CROSS-REFERENCE TO RELATED APPLICATIONS

This non-provisional application claims priority under 35 U.S.C. § 119(a) on Patent Application No(s). 106131482 filed in Taiwan R.O.C on Sep. 13, 2017, the entire contents of which are hereby incorporated by reference.

TECHNICAL FIELD

The disclosure relates to a display device, more particularly to a display device including a light modulator and display panel.

BACKGROUND

With the development of smart devices, many display devices, such as portable electronic devices and automotive equipment, are being used in our daily lives. In order to allow a display device to provide clear and non-glare images under different conditions, a conventional display device adjusts image brightness by adjusting an intensity of light emitted by a light source, and the light intensity of the light source is adjusted according to an intensity of ambient light. In a display device using light emitting diodes (LEDs) as the light source, the intensity of light is adjusted by a drive current in the LEDs.

SUMMARY

According to one aspect of the disclosure, a display device includes a display panel and at least one light modulation panel. The display panel includes a substrate and a plurality of micro light emitting semiconductors disposed on the substrate. The light modulation panel is disposed on a light emitting surface of the display panel and includes a light modulation unit. The light modulation panel is configured to change a transmittance of the light modulation unit according to a light modulation control signal.

According to another aspect of the disclosure, a display device includes a display panel and at least one light modulation panel. The display panel includes a substrate and a plurality of micro light emitting semiconductors disposed on the substrate. The light modulation panel is disposed on a light emitting surface of the display panel and includes a light modulation unit, and a transmittance of the light modulation unit has a positive correlation to an intensity of ambient light.

BRIEF DESCRIPTION OF THE DRAWINGS

The present invention will become better understood from the detailed description given hereinbelow and the accompanying drawings which are given by way of illustration only and thus are not limitive of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
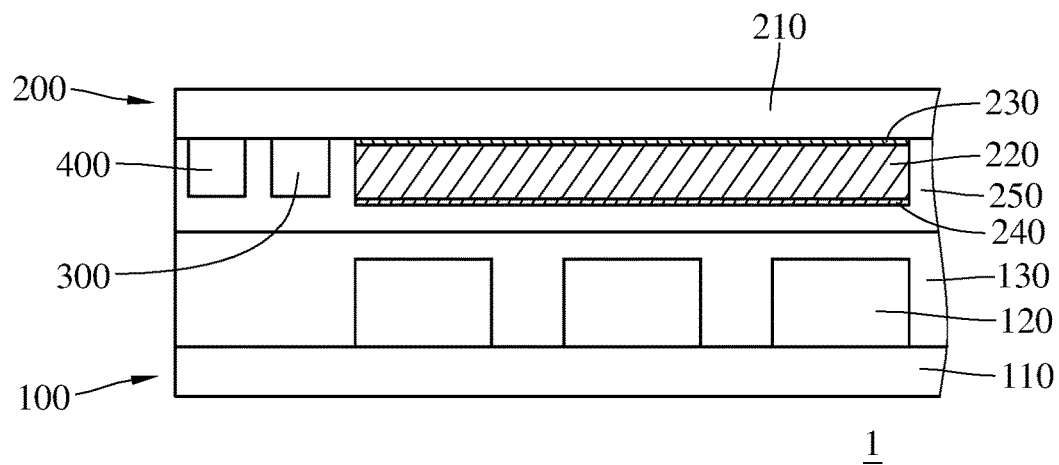
FIG. 1 is a cross-sectional view of a display device according to a first embodiment of the disclosure.

Please refer to FIG. 1 showing a cross-sectional view of a display device according to a first embodiment of the disclosure. In this embodiment, a display device 1 includes a display panel 100, a light modulation panel 200, an optical sensor 300 and a controller 400.

The display panel 100 includes a substrate 110, a plurality of micro light emitting semiconductors 120 and a protection layer 130. The substrate 110, for example, is a complementary metal-oxide semiconductor (CMOS) substrate, a liquid crystal on silicon (LCOS) substrate, a thin film transistor (TFT) substrate or other substrates containing driver circuit. The micro light emitting semiconductors 120 is disposed on substrate 110 in a matrix manner, and the micro light emitting semiconductors 120 are electrically connected to the driver circuit on the substrate 110. The micro light emitting semiconductor 120, for example, is a micro LED. The protection layer 130 is disposed on the substrate 110, and the micro light emitting semiconductors 120 are located between the protection layer 130 and the substrate 110. The protection layer 130 is configured to protect the micro light emitting semiconductors 120 so as to prevent influences on the micro light emitting semiconductors 120 due to external air or water. The protection layer 130, for example, is made of epoxy, silicon oxide or transparent polymer.

The light modulation panel 200 is disposed on a light emitting surface of the display panel 100. The light modulation panel 200 includes a support 210, a light modulation unit 220, a first electrode 230, a second electrode 240 and a protection layer 250. The first electrode 230 is disposed between the support 210 and the second electrode 240. The support 210, for example, is a transparent glass plate or a transparent polymer plate. Both the first electrode 230 and the second electrode 240, for example, are made of a transparent conductor such as indium tin oxide (ITO) and indium zinc oxide (IZO).

The light modulation unit 220 is disposed between the first electrode 230 and the second electrode 240. The light modulation unit 220 includes electrochromic material such as viologen, titanium dioxide, polyoxotungstate, tungsten trioxide or polyaniline. When the voltage applied to the light modulation unit 220 by the first electrode 230 and the second electrode 240 is changed, the transmittance of the light modulation unit 220 is also changed. For example, when the first electrode 230 and the second electrode 240 apply a voltage of 5V to the light modulation unit 220, the transmittance of the light modulation unit 220 reduces. The reduction of the transmittance is dependent on the material, and it is worth noting that the present disclosure is not limited to the aforementioned example.

The protection layer 250 is disposed on the support 210. The light modulation unit 220, the first electrode 230 and the second electrode 240 are located between the protection layer 250 and the support 210. The protection layer 250 is configured to protect the light modulation unit 220, the first electrode 230 and the second electrode 240 so as to prevent influences on the light modulation unit 220, the first electrode 230 and the second electrode 240 due to external air or water. The protection layer 250, for example, is made of epoxy, silicon oxide or transparent polymer.

In this embodiment, the light modulation panel 200 is disposed on the light emitting surface of the display panel 100, and a surface of the protection layer 250 away from the support 210 faces toward a light emitting surface of the protection layer 130, but the present disclosure is not limited thereto. In some other embodiments, the light modulation panel is disposed on the light emitting surface of the display panel, and a surface of the support away from the light modulation unit faces toward the light emitting surface of the protection layer.

The optical sensor 300 is disposed on the support 210 of the light modulation panel 200. The optical sensor 300 is configured to sense an intensity of ambient light in an environment where the display device 1 is located. A sensing area (not shown in the drawing) of the optical sensor 300, for example, is opposite to the display panel 100 or faces toward an external environment where the display device 1 is located. In this embodiment, the optical sensor 300 is a micro-scale optical sensor with sophisticated light sensing capability. Specifically, the optical sensor 300, for example, is a CMOS, a charge-coupled device (CCD), a photodiode or a photosensitive element. The optical sensor 300 is disposed near the periphery of the support 210 such that the display screen is prevented from blocked by the optical sensor 300. It is worth noting that the present disclosure is not limited to the position of the optical sensor. In some other embodiments, the optical sensor is located in another position where it is able to receive ambient light.

The controller 400 is disposed on the support 210 of the light modulation panel 200. The controller 400 is electrically connected to the light modulation unit 220 and the optical sensor 300 via a circuit structure (not shown in the drawing). The circuit structure may be a transparent conductive pattern which does not block the display screen. The controller 400 receives the intensity of ambient light from the optical sensor 300 and generates a light modulation control signal by comparing the intensity of ambient light with a predetermined intensity of ambient light. The predetermined intensity of ambient light, for example, is a light intensity which is comfortable for the human eye to achieve visual comfort. The value of the predetermined intensity of ambient light is stored in a memory medium of the controller 400 or an external memory medium (not shown in the drawings) electrically connected to the controller 400. The light modulation control signal is transmitted from the controller 400 through the circuit structure into the light modulation unit 220 in order to adjust the transmittance of the light modulation unit 220, and there is a logarithmic relationship between the transmittance of the light modulation unit 220 and a sensitivity of the human eye to light. In detail, when the intensity of ambient light is greater than the predetermined intensity of ambient light, the controller 400 generates the light modulation control signal to enhance the transmittance of the light modulation unit 220. When the intensity of ambient light is less than the predetermined intensity of ambient light, the controller 400 generates the light modulation control signal to reduce the transmittance of the light modulation unit 220. In this embodiment, the controller 400 is a micro-scale controller provided to control the transmittance precisely. Specifically, the controller 400, for example, is a digital signal processor (DSP), a central processing unit (CPU) or a micro control unit (MCU), but the present disclosure is not limited thereto.

In this embodiment, the light modulation panel 200 changes the transmittance of the light modulation unit 220 according to the light modulation control signal generated by the controller 400. Thus, when the display device 1 is located in an environment with high intensity of ambient light (high light condition), the light modulation unit 220 is driven to a high transmittance state by the light modulation control signal, such that most of the amount of light emitted by the micro light emitting semiconductors 120 is able to pass through the light modulation panel 200, thereby providing clear images. When the display device 1 is located in an environment with low intensity of ambient light (low light condition), the light modulation unit 220 is driven to a low transmittance state by the light modulation control signal, such that only a small amount of light emitted by the micro light emitting semiconductors 120 is able to pass through the light modulation panel 200, thereby preventing uncomfortable visual effect due to overly bright images.

Moreover, the light modulation panel 200 of the display device 1 is used to adjust image brightness, such that the image brightness is changed according to the transmittance of the light modulation panel 200. The intensity of device light emitted by the micro light emitting semiconductor 120 only slightly changed by a drive current. Therefore, the adjustment of image brightness is less dependent on the drive current in the micro light emitting semiconductor 120, such that an unreliable adjustment of image brightness due to the difficult control of the intensity of device light emitted by the micro light emitting semiconductor 120 is prevented.

In this embodiment, the optical sensor 300 is configured to sense the intensity of ambient light in the environment where the display device 1 is located, but the present disclosure is not limited thereto. In some other embodiments, the optical sensor is configured to sense the intensity of device light emitted by the micro light emitting semiconductors, and the sensing area of the optical sensor faces toward the display panel. A value of a predetermined intensity of device light is stored in the controller. The controller receives the intensity of device light from the optical sensor and generates the light modulation control signal by comparing the intensity of device light with the predetermined intensity of device light. The light modulation panel changes the transmittance of the light modulation unit according to the light modulation control signal. In detail, when the intensity of device light is greater than the predetermined intensity of device light, the controller generates the light modulation control signal to reduce the transmittance of the light modulation unit. Therefore, when an image with high brightness is displayed, the light modulation unit of the light modulation panel prevents the light intensity of the micro light emitting semiconductor from being overly high, thereby alleviating human eye irritation.

Figure 2:
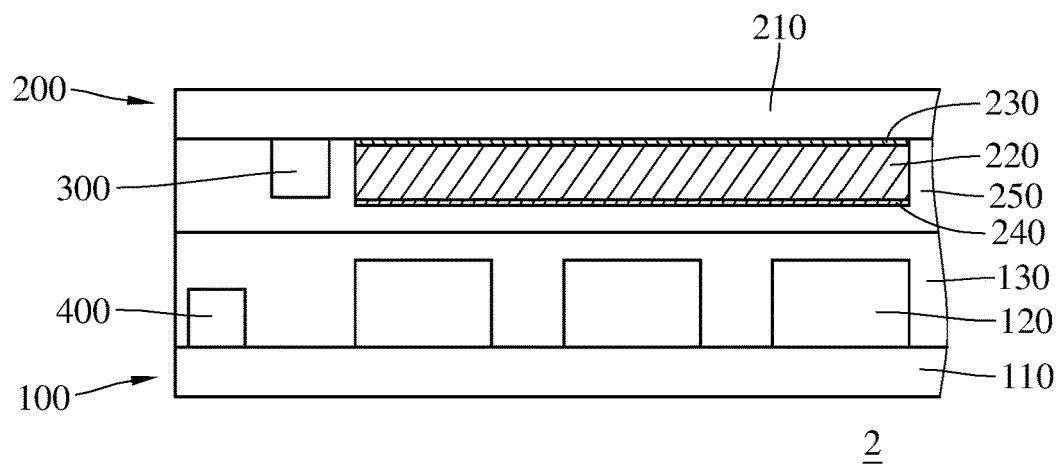
FIG. 2 is a cross-sectional view of a display device according to a second embodiment of the disclosure.

FIG. 2 is a cross-sectional view of a display device according to a second embodiment of the disclosure. Since the second embodiment is similar to the first embodiment, only the differences will be illustrated hereafter. In this embodiment, a display device 2 includes a controller 400 electrically connected to multiple micro light emitting semiconductors 120.

In detail, the controller 400 is disposed on a substrate 110 of a display panel 100. The controller 400 is electrically connected to the micro light emitting semiconductors 120, a light modulation unit 220 and an optical sensor 300 via a circuit structure (not shown in the drawing). The circuit structure may be a transparent conductive pattern. The display panel 100 and the light modulation panel 200 shares the controller 400 which controls the transmittance of the light modulation unit 220 of the light modulation panel 200. In this embodiment, the controller 400 is disposed on the substrate 110, but the present disclosure is not limited thereto. In some other embodiments, the controller is disposed on a support 210 or a suitable position in the display device where the controller works normally.

The controller 400 receives the intensity of ambient light from the optical sensor 300. The controller 400 compares the intensity of ambient light with the predetermined intensity of ambient light to generate a result of the comparison. The controller 400 receives a drive current intensity from the micro light emitting semiconductors 120. The controller 400 compares the drive current intensity in the micro light emitting semiconductors 120 with a predetermined drive current intensity to generate another result of the comparison. Further, the controller 400 generates the light modulation control signal according to the two results of the comparison. The values of the predetermined intensity of ambient light and the predetermined drive current intensity are stored in a memory medium of the controller 400 or an external memory medium (not shown in the drawings) electrically connected to the controller 400.

The light modulation control signal is transmitted from the controller 400 through the circuit structure into the light modulation unit 220 in order to adjust the transmittance of the light modulation unit 220. In detail, when the intensity of ambient light is greater than the predetermined intensity of ambient light and the drive current intensity is less than the predetermined drive current intensity, the controller 400 generates the light modulation control signal to enhance the transmittance of the light modulation unit 220. When the intensity of ambient light is greater than the predetermined intensity of ambient light and the drive current intensity is greater than the predetermined drive current intensity, the controller 400 generates the light modulation control signal to reduce the transmittance of the light modulation unit 220. When the intensity of ambient light is less than the predetermined intensity of ambient light and the drive current intensity is less than the predetermined drive current intensity, the controller 400 generates the light modulation control signal to reduce the transmittance of the light modulation unit 220. When the intensity of ambient light is less than the predetermined intensity of ambient light and the drive current intensity is greater than the predetermined drive current intensity, the controller 400 generates the light modulation control signal to reduce the transmittance of the light modulation unit 220.

In this embodiment, the light modulation panel 200 changes the transmittance of the light modulation unit 220 according to the light modulation control signal generated by the controller 400. Thus, when the display device 2 is located in an environment with high intensity of ambient light and a high drive current intensity is provided in the micro light emitting semiconductor 120 (greater intensity of device light than a predetermined intensity of device light), the light modulation unit 220 is driven to the high transmittance state such that most amount of light emitted by the micro light emitting semiconductors 120 is able to pass through the light modulation panel 200, thereby providing clear images. In the following three cases, the light modulation unit 220 is driven to the low transmittance state such that only a small amount of light emitted by the micro light emitting semiconductors 120 is able to pass through the light modulation panel 200, thereby preventing a user from being uncomfortable due to overly bright images. The three cases are: the display device 2 is located in the environment with a high intensity of ambient light and a high drive current intensity is provided in the micro light emitting semiconductor 120; the display device 2 is located in the environment with low intensity of ambient light and a high drive current intensity is provided in the micro light emitting semiconductor 120; and the display device 2 is located in the environment with a low intensity of ambient light and a low drive current intensity is provided in the micro light emitting semiconductor 120 (less intensity of device light than the predetermined intensity of device light).

Moreover, the light modulation panel 200 of the display device 2 is used to adjust image brightness, such that the image brightness is changed according to the transmittance of the light modulation panel 200. The intensity of device light emitted by the micro light emitting semiconductor 120 is only slightly changed by the drive current. Therefore, the adjustment of image brightness is less dependent on the drive current in the micro light emitting semiconductor 120, such that an unreliable adjustment of image brightness due to the difficult control of the intensity of device light emitted by the micro light emitting semiconductor 120 is prevented.

In this embodiment, the display panel 100 and the light modulation panel 200 shares the controller 400, but the present disclosure is not limited thereto. In some other embodiments, the display device includes multiple electrically connected controllers which are respectively configured to control the emission of light and the transmittance to generate drive current intensity.

Figure 3:
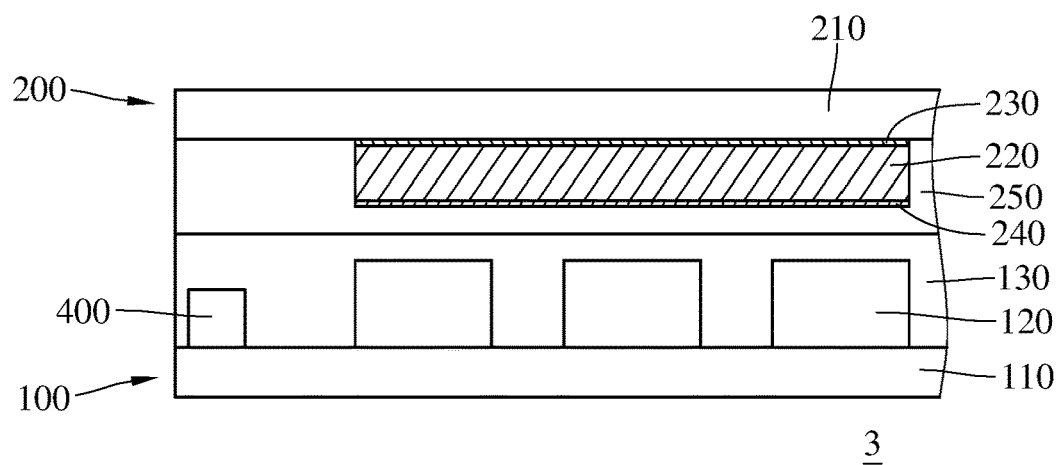
FIG. 3 is a cross-sectional view of a display device according to a third embodiment of the disclosure.

FIG. 3 is a cross-sectional view of a display device according to a third embodiment of the disclosure. Since the third embodiment is similar to the second embodiment, only the differences will be illustrated hereafter. In this embodiment, a display device 3 does not include any optical sensor equivalent to the optical sensor 300.

In detail, in the display device 3, a controller 400 is disposed on a substrate 110 of a display panel 100. The controller 400 is electrically connected to multiple micro light emitting semiconductors 120 and a light modulation unit 220 via a circuit structure (not shown in the drawing). The display panel 100 and the light modulation panel 200 shares the controller 400 which controls the transmittance of the light modulation unit 220 of the light modulation panel 200. In this embodiment, the controller 400 is disposed on the substrate 110 to have less influence on the display screen of the display panel 100, but the present disclosure is not limited thereto. In some other embodiments, the controller is disposed on a support 210 or a suitable position in the display device where the controller works normally.

The controller 400 receives a drive current intensity from the micro light emitting semiconductors 120 which are electrically connected to the controller 400. The controller 400 compares the drive current intensity with a predetermined drive current intensity to generate a light modulation control signal drive current intensity. The value of the predetermined drive current intensity is stored in a memory medium of the controller 400 or an external memory medium (not shown in the drawings) electrically connected to the controller 400. The light modulation control signal is transmitted from the controller 400 through a circuit structure (not shown in the drawing) into the light modulation unit 220 in order to adjust the transmittance of the light modulation unit 220. In detail, when the drive current intensity is greater the predetermined drive current intensity, the controller 400 generates the light modulation control signal to reduce the transmittance of the light modulation unit 220. Thus, when the display device 3 displays an image with high brightness, the light modulation unit 220 of the light modulation panel 200 is favorable for preventing the light intensity of the micro light emitting semiconductors 120 from being overly high, thereby alleviating human eye irritation.

Moreover, the light modulation panel 200 of the display device 3 is used to adjust image brightness, such that the image brightness is changed according to the transmittance of the light modulation panel 200. The intensity of device light emitted by the micro light emitting semiconductor 120 only slightly changed by a drive current. Therefore, the adjustment of image brightness is less dependent on the drive current in the micro light emitting semiconductor 120, such that an unreliable adjustment of image brightness due to the difficult control of the intensity of device light emitted by the micro light emitting semiconductor 120 is prevented.

In this embodiment, the display panel 100 and the light modulation panel 200 shares the controller 400, but the present disclosure is not limited thereto. In some other embodiments, the display device includes multiple electrically connected controllers which are respectively configured to control the emission of light and the transmittance to generate drive current intensity.

Figure 4:
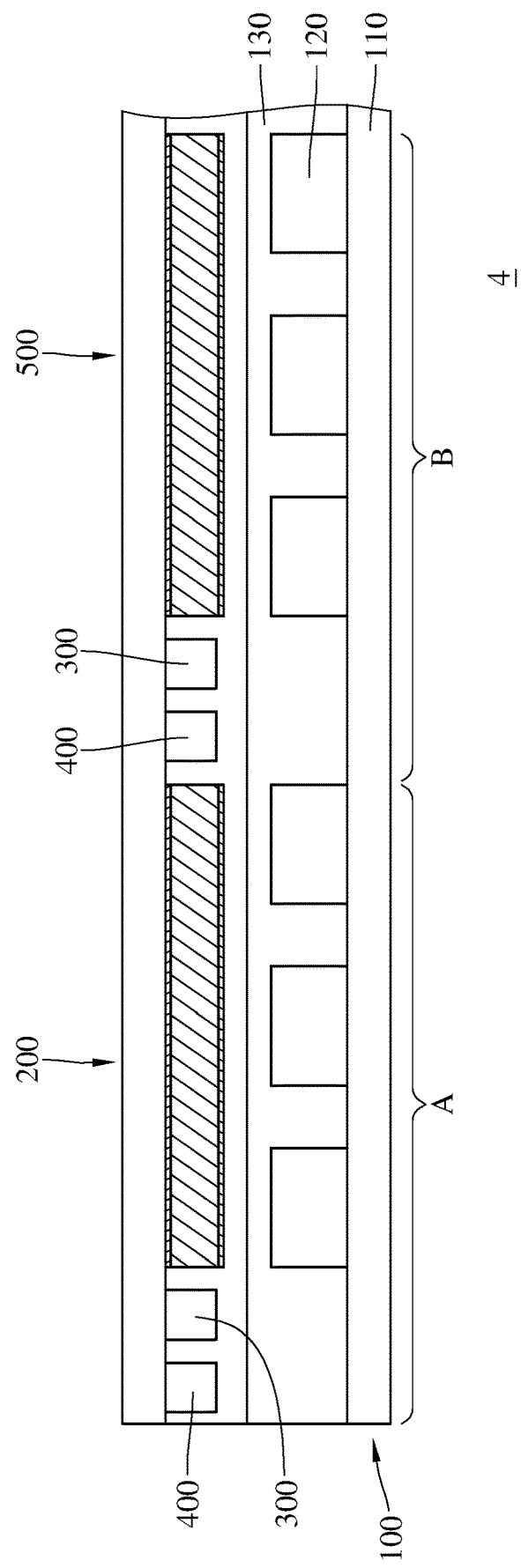
FIG. 4 is a cross-sectional view of a display device according to a fourth embodiment of the disclosure.

FIG. 4 is a cross-sectional view of a display device according to a fourth embodiment of the disclosure. In this embodiment, a display device 4 includes a display panel 100, a light modulation panel 200, two optical sensors 300, two controllers 400 and a light modulation panel 500.

Since the fourth embodiment is similar to the first embodiment, only the differences will be illustrated hereafter. The display panel 100 of the display device 4 defines a first pixel area A and a second pixel area B in a direction parallel to an extension of a display surface of the display panel 100. The first pixel area A is connected to the second pixel area B. Both the first pixel area A and the second pixel area B have a size equal to a single pixel or multiple pixels.

The light modulation panel 200 and the light modulation panel 500 are respectively disposed in the first pixel area A and the second pixel area B. In detail, the light modulation panel 200 is disposed on a section of a light emitting surface of the display panel 100 in the first pixel area A, and the light modulation panel 500 is disposed on another section of the light emitting surface in the second pixel area B. Both of the light modulation panels 200 and 500 have a similar configuration to the light modulation panel 200 in the aforementioned embodiments. The light modulation panel 200 and the light modulation panel 500 are disposed on two different portions of a support, respectively.

The two optical sensors 300 are disposed in the first pixel area A and the second pixel area B, respectively. The two controllers 400 are also disposed in the first pixel area A and the second pixel area B, respectively. In this embodiment, the arrangement and operation between the optical sensor 300 and the controller 400 in both the first pixel area A and the second pixel area B are similar to the optical sensor 300 and the controller 400 in the first embodiment. In an embodiment where a display device includes multiple light modulation panels, the arrangement and operation between the optical sensor and the controller are similar to the optical sensor 300 and the controller 400 in the second embodiment.

In addition to the advantages mentioned in the first through the third embodiments, since the light modulation panel 200 and the light modulation panel 500 respectively correspond to the first pixel area A and the second pixel area B, the transmittance of the light modulation panel 200 and the transmittance of the light modulation panel 500 are changeable independently. Thus, it is favorable for individually adjusting the brightness of two regions in an image which is respectively in the first pixel area A and the second pixel area B, thereby obtaining better image quality.

In this embodiment, the display device 4 includes both the optical sensor 300 and the controller 400, but the present disclosure is not limited thereto. In some other embodiments, the display device includes a controller but does not include the optical sensor, and the arrangement and operation of the controller are similar to the controller 400 in the third embodiment. Thus, it is favorable for two light modulation panels adjusting the brightness of two regions in an image which is respectively in the first pixel area A and the second pixel area B, thereby obtaining better image quality.

Figure 5:
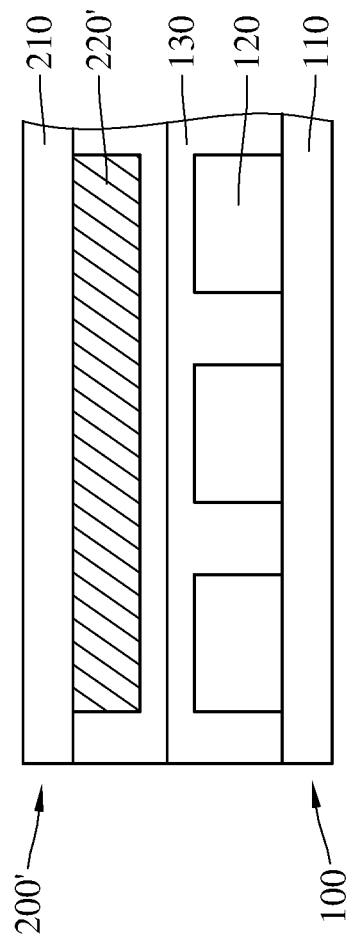
FIG. 5 is a cross-sectional view of a display device according to a fifth embodiment of the disclosure.

FIG. 5 is a cross-sectional view of a display device according to a fifth embodiment of the disclosure. In this embodiment, a display device 5 includes a display panel 100 and a light modulation panel 200'.

The display panel 100 includes a substrate 110, multiple micro light emitting semiconductors 120 and a protection layer 130. Since the fifth embodiment is similar to the first embodiment, only the differences will be illustrated hereafter.

The light modulation panel 200' is disposed on a light emitting surface of the display panel 100. The light modulation panel 200' includes a support 210, a light modulation unit 220' and a protection layer 250. The support 210, for example, is a transparent glass plate or a transparent polymer plate. The light modulation unit 220' is disposed on a surface of the support 210 facing toward the display panel 100. The light modulation unit 220' includes a photochromic material. When energy applied to the light modulation unit 220' by ambient light (that is, the intensity of ambient light) is changed, the transmittance of the light modulation unit 220' is changed according to the intensity of ambient light. The transmittance of the light modulation unit 220' has a positive correlation or is proportional to the intensity of ambient light. There is a logarithmic relationship between the transmittance of the light modulation unit 220' and a sensitivity of the human eye to light.

The protection layer 250 is disposed on the support 210, and the light modulation unit 220' is located between the protection layer 250 and the support 210. The protection layer 250 is configured to protect the light modulation unit 220' so as to prevent influences on the light modulation unit 220' due to external air or water. The protection layer 250, for example, is made of epoxy, silicon oxide or transparent polymer.

In this embodiment, the light modulation panel 200' is disposed on the light emitting surface of the display panel 100, and a surface of the protection layer 250 away from the support 210 faces toward a surface of the protection layer 130 away from the substrate 110, but the present disclosure is not limited thereto. In some other embodiments, the light modulation panel is disposed on the light emitting surface of the display panel, and a surface of the support away from the light modulation unit faces toward a surface of the protection layer away from the substrate.

The transmittance of the light modulation unit 220' is changed according to the intensity of ambient light. In detail, when a high intensity of ambient light is provided, the light modulation unit 220' is in a high transmittance state, such that most of the amount of light emitted by the micro light emitting semiconductors 120 is able to pass through the light modulation panel 200', thereby providing clear images. When a low intensity of ambient light is provided, the light modulation unit 220' is in a low transmittance state, such that only a small amount of light emitted by the micro light emitting semiconductors 120 is able to pass through the light modulation panel 200', thereby preventing an uncomfortable visual effect due to overly bright images.

Moreover, the light modulation panel 200' of the display device 5 is used to adjust image brightness, such that the image brightness is changed according to the transmittance of the light modulation panel 200'. The intensity of device light emitted by the micro light emitting semiconductor 120 only slightly changed by the drive current. Therefore, the adjustment of image brightness is less dependent on the drive current in the micro light emitting semiconductor 120, such that an unreliable adjustment of image brightness due to the difficult control of the intensity of device light emitted by the micro light emitting semiconductor 120 is prevented.

Figure 6:
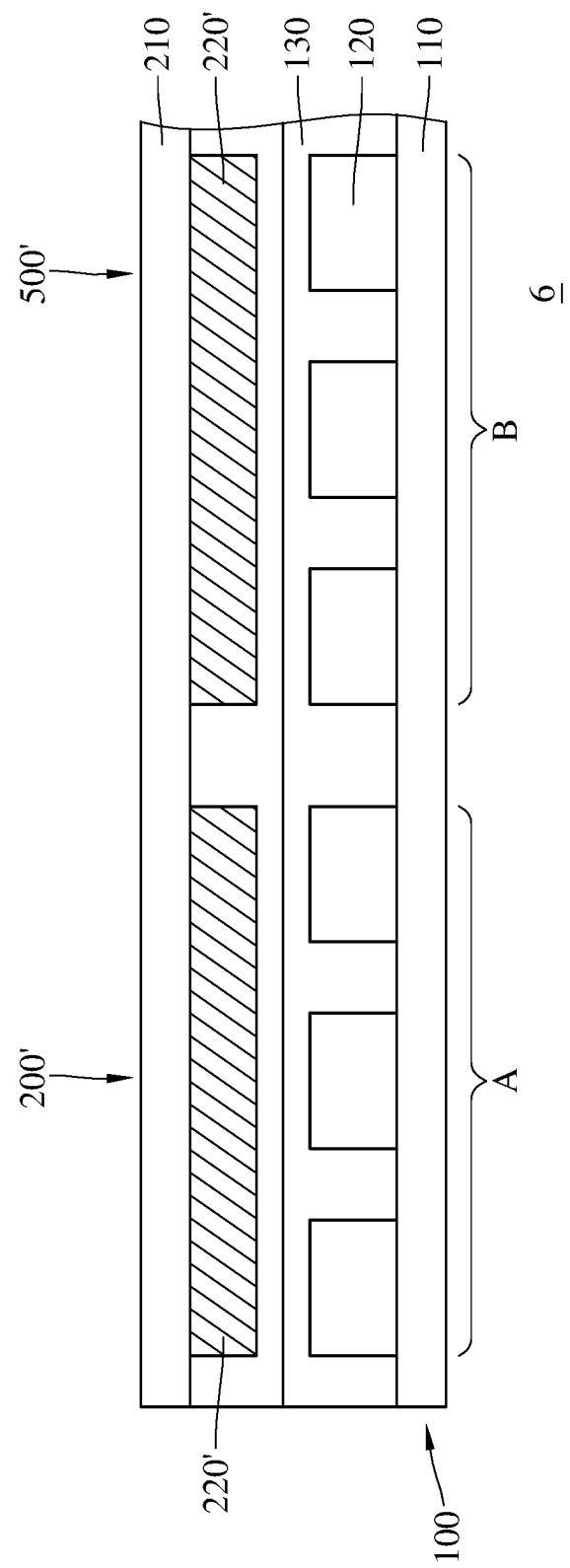
FIG. 6 is a cross-sectional view of a display device according to a sixth embodiment of the disclosure.

FIG. 6 is a cross-sectional view of a display device according to a sixth embodiment of the disclosure. In this embodiment, a display device 6 includes a display panel 100, a light modulation panel 200' and a light modulation panel 500'.

Since the sixth embodiment is similar to the fourth embodiment, only the differences will be illustrated hereafter.

The light modulation panel 200' and the light modulation panel 500' are respectively disposed in a first pixel area A and a second pixel area B. In detail, the light modulation panel 200' is disposed on a section of a light emitting surface of the display panel 100 in the first pixel area A, and the light modulation panel 500' is disposed on another section of the light emitting surface in the second pixel area B. Both the light modulation panels 200' and 500' have a similar configuration to the light modulation panel 200' in the aforementioned embodiments. The light modulation panel 200' and the light modulation panel 500' are disposed on two different portions of a support 210, respectively.

In addition to the advantages mentioned in the fifth embodiment, since the light modulation panel 200' and the light modulation panel 500' respectively correspond to the first pixel area A and the second pixel area B, the transmittance of the light modulation panel 200' and the transmittance of the light modulation panel 500' is changeable independently. Thus, it is favorable for individually adjusting the brightness of two regions in an image which is respectively in the first pixel area A and the second pixel area B, thereby obtaining better image quality.

According to the disclosure, the light modulation panel of the display device adjusts the transmittance of the light modulation unit, including the electrochromic material, according to the light modulation control signal. When the intensity of ambient light is greater than the predetermined intensity, the light modulation control signal drives the light modulation unit to high transmittance state; and when the intensity of ambient light is less than the predetermined intensity, the light modulation control signal drives the light modulation unit to low transmittance state. The transmittance of the light modulation unit is controlled by both the intensity of ambient light and the intensity of device light. The device light is emitted by the micro light emitting semiconductor, and the intensity of device light is determined according to the drive current in the micro light emitting semiconductor. Therefore, the image brightness is changed according to the transmittance of the light modulation panel, and the change of transmittance is dependent on a combination of the ambient light and the drive current in the micro light emitting semiconductor, thereby preventing an unreliable adjustment of the transmittance due to the difficult control of the intensity of device light emitted by the micro light emitting semiconductor.

Furthermore, the light modulation panel of the display device adjusts the transmittance of the light modulation unit, including the photochromic material, according to the intensity of ambient light, such that the transmittance of the light modulation unit has a positive correlation or is proportional to the intensity of ambient light. Therefore, the image brightness is changed according to the transmittance of the light modulation panel, and the change of transmittance is dependent on a combination of the ambient light and the drive current in the micro light emitting semiconductor, such that an unreliable adjustment of the transmittance due to the difficult control of the intensity of device light emitted by the micro light emitting semiconductor is prevented.

Moreover, when the display device includes two light modulation panels which respectively correspond to the first pixel area and the second pixel area of the display panel, the brightness of two different regions in an image, which is respectively in the first pixel area and the second pixel area, is adjusted individually, thereby obtaining better image quality.

The foregoing description, for the purpose of explanation, has been described with reference to specific embodiments; however, the embodiments were chosen and described in order to explain the principles of the disclosure and its practical applications, to thereby enable others skilled in the art to utilize the disclosure and various embodiments with various modifications as are suited to the particular use being contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. A display device, comprising: a display panel comprising
   a substrate and a plurality of micro light emitting semiconductors disposed on the substrate; and
   at least one light modulation panel disposed on a light emitting surface of the display panel, the at least one light modulation panel comprising a light modulation unit, and the at least one light modulation panel being configured to change a transmittance of the light modulation unit according to a light modulation control signal, wherein:
      the light modulation control signal drives the light modulation unit to a high transmittance state when an intensity of ambient light is greater than a predetermined intensity of ambient light and a drive current intensity in the plurality of micro light emitting semiconductors is less than a predetermined drive current intensity;
      the light modulation control signal drives the light modulation unit to a low transmittance state when the intensity of ambient light is greater than the predetermined intensity of ambient light and the drive current intensity is greater than the predetermined drive current intensity;
      the light modulation control signal drives the light modulation unit to the low transmittance state when the intensity of ambient light is less than the predetermined intensity of ambient light and the drive current intensity is less than the predetermined drive current intensity; and
      the light modulation control signal drives the light modulation unit to the low transmittance state when the intensity of ambient light is less than the predetermined intensity of ambient light and the drive current intensity is greater than the predetermined drive current intensity.

2. The display device according to claim 1, further comprising an optical sensor and a controller, wherein the optical sensor is configured to sense the intensity of ambient light or the intensity of device light emitted by the plurality of micro light emitting semiconductors, the controller is electrically connected to the optical sensor and the at least one light modulation panel, and the controller generates the light modulation control signal according to the intensity of ambient light or the intensity of device light.

3. The display device according to claim 2, wherein the controller is electrically connected to the plurality of micro light emitting semiconductors, and the controller generates the light modulation control signal according to the intensity of ambient light and the drive current intensity in the plurality of micro light emitting semiconductors.

4. The display device according to claim 1, wherein the light modulation unit comprises an electrochromic material.

5. The display device according to claim 1, wherein a number of the at least one light modulation panel is two, the display panel defines a first pixel area and a second pixel area, and the two light modulation panels are respectively disposed in the first pixel area and the second pixel area.

6. The display device according to claim 1, wherein there is a logarithmic relationship between the transmittance of the light modulation unit and a sensitivity of human eye to light.

* * * * *